US006834366B2

(12) United States Patent
Kim et al.

(10) Patent No.: US 6,834,366 B2
(45) Date of Patent: Dec. 21, 2004

(54) METHOD OF OUTPUTTING INTERNAL INFORMATION THROUGH TEST PIN OF SEMICONDUCTOR MEMORY AND OUTPUT CIRCUIT THEREOF

(75) Inventors: Nam-Seog Kim, Seoul (KR); Kwang-Jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 09/957,885

(22) Filed: Sep. 21, 2001

(65) Prior Publication Data

US 2002/0152439 A1 Oct. 17, 2002

(30) Foreign Application Priority Data

Apr. 11, 2001 (KR) ........................................ 2001-19153

(51) Int. Cl.[7] .............................................. G01R 31/28
(52) U.S. Cl. ........................................ 714/734; 714/30
(58) Field of Search ................................ 714/734, 740, 714/30

(56) References Cited

U.S. PATENT DOCUMENTS

| | | | | |
|---|---|---|---|---|
| 5,107,208 A | * | 4/1992 | Lee | ............................ 714/733 |
| 5,610,927 A | * | 3/1997 | Segars | ......................... 714/730 |
| 5,717,695 A | * | 2/1998 | Manela et al. | ............... 714/718 |
| 5,744,949 A | * | 4/1998 | Whetsel | .................... 324/158.1 |
| 6,091,261 A | * | 7/2000 | De Lange | ..................... 326/38 |
| 6,108,252 A | | 8/2000 | Park | |
| 6,117,696 A | * | 9/2000 | Loughmiller et al. | .......... 438/17 |
| 6,243,842 B1 | * | 6/2001 | Slezak et al. | ................ 714/724 |
| 6,339,357 B1 | * | 1/2002 | Yamasaki et al. | ............ 327/538 |
| 6,509,778 B2 | * | 1/2003 | Braceras et al. | ............. 327/308 |
| 6,629,268 B1 | * | 9/2003 | Arimilli et al. | ................ 714/42 |
| 6,662,325 B1 | * | 12/2003 | Golshan | ..................... 714/726 |
| 6,671,841 B1 | * | 12/2003 | Golshan | ..................... 714/729 |

OTHER PUBLICATIONS

IEEE Standard 1149.1, 1990.*

* cited by examiner

*Primary Examiner*—Guy J. Lamarre
*Assistant Examiner*—John P. Trimmings
(74) *Attorney, Agent, or Firm*—F. Chau & Associates, LLC

(57) ABSTRACT

A circuit and method for selectively outputting internal information in a semiconductor memory device comprising a test circuit such as a JTAG test circuit. The internal information is selectively output through a test pin of the test circuit during a normal operation mode of the semiconductor memory. The internal information of a semiconductor memory chip is output as either a digital or analog signal without having to add additional package pins.

16 Claims, 6 Drawing Sheets

METHOD OF OUTPUTTING INTERNAL INFORMATION THROUGH TEST PIN OF SEMICONDUCTOR MEMORY AND OUTPUT CIRCUIT THEREOF

BACKGROUND OF THE INVENTION

1. Technical Field

The present invention relates generally to a semiconductor memory, and more particularly, to a method for selectively outputting internal information of a semiconductor memory without adding output pins, as well as a circuit for selectively outputting such internal information.

2. Description of Related Art

As a consequence of the increasing density of circuit devices in a semiconductor chip due to improvements in circuit design and methods for fabricating semiconductor devices, the testing of various electrical characteristics and functional characteristics of circuit devices in a chip by using built in self test (BIST) methods will become increasingly important. Indeed, to enhance production yield, testing is necessary to determine whether there are defects in a chip or for analyzing failed portions in a chip and, thereby, provide feedback to the fabricating processes. As the integration density increases, however, the effective testing becomes increasingly difficult and, consequently, the cost for such tests increases.

To mitigate the problems associated with testing circuits comprising high integration density, functional modules are formed by assembling integrated circuits and graded system design has been developed to form a system by combination of the modules. Accordingly, board or system level testing has evolved to require a more systematic design for testability (DFT). In order to meet such requirement, a boundary scan design that has been studied by Joint Test Action Group (JTAG) in the late 1980's was standardized according to IEEE in 1990. The JTAG standard, which has been widely used in this field, is defined by IEEE 1149.1, IEEE standard test access port and boundary scan architecture. The IEEE standard 1149.1 is disclosed in the reference "IEEE computer society press, 1990" which defines test access port and boundary scan architecture.

To solve node access problems or all node test problems that are created during testing of a system board consisting of surface mount, tape automated bonding, miniaturized components, multi chip module (MCM), complex ASICs, etc., IEEE suggests standards of device manufacturing and loaded circuit board testing, which is called Joint Test Action Group (JTAG).

Generally, the JTAG logic is employed for testing a semiconductor memory chip such as static random access memory (SRAM) using a ball grid array (BGA). In the SRAM, when performing the boundary scan test wherein a shift resistor is provided between each of the device pins and internal logic, currently, the only testing that is performed is whether a short and open in each of pins is created. The reason is that the signal delay and the overhead associated with chip size are created when all the JTAG IEEE 1149.1 standards are used in an SRAM.

Generally, the test circuit such as the JTAG logic is operated in a specific operation mode, for example, a test mode, not in a normal mode in which a semiconductor memory chip is normally operated. Accordingly, the test circuit serves to check for potential defects of a chip in a test mode only, but cannot check the operation state of the chip during a normal mode of operation.

Designers and users of semiconductor memories, however, desire to monitor the state of each of the signals in a chip during normal operation of the chip, and not just testing the chip in a test mode. Indeed, if a designer can obtain internal information of a chip at an early stage of development of a memory product, each of the functional blocks of the semiconductor memory can be effectively evaluated, which can lead to a reduction of the development period. Moreover, users may desire to check the internal timing delay and the internal reference voltage of peripheral circuits provided in a semiconductor memory so as to effectively apply the semiconductor memory in a desired system. For example, a user may require adding an option to a semiconductor memory having a high-speed interface, by which internal reference voltage and data sampling clock, etc. can be controlled by an external digital signal.

It is therefore highly desirable to provide a testing function that allows a user, for example, to check internal information of a chip during a normal mode of operation. It is very difficult, however, to assign additional package pins to the semiconductor memory chip without any preparations. The reason is that it is even difficult, in the first instance, to arrange the package pins that are needed in memory operation of a highly integrated semiconductor memory having a relatively fixed package size. As a result, the integration density of semiconductor memory tends to increase rapidly, but it is a very critical problem to assign package pins to the semiconductor memory because package size is difficult to change. Therefore, it is desirable to minimize the number of test pins that do not directly relate to the operation of semiconductor memory, relative to the insufficient assignment of package pins.

With the conventional technique, it is difficult to monitor the internal state of chip as a test circuit fabricated for test with an external package pin because of such a lack of a phenomenon in pin assignment when the chip normally operates. Thus, anticipation evaluation has been performed through simulation thereby decreasing reliability in test of the internal information.

As described above, in the conventional technique, because of the difficulty in separately assigning package pins that output internal information in a normal operation of chip, a disadvantage is that the internal state of a chip cannot be exactly monitored. Accordingly, an improved technique for accurate monitoring the states of various internal signals during a normal mode of operation without the addition of package pins, is highly desirable.

SUMMARY OF THE INVENTION

Accordingly, it is an object of the present invention to provide an improved technique by which the aforementioned problems can be solved.

It is another object of the present invention to provide a circuit and a method for accurately monitoring the state of various internal signals that are generated in a normal operation of chip using a smaller number of pins than in the conventional techniques.

It is yet another object of the present invention to provide a selective output method and an output circuit therefor by which internal information can be externally output through conventional test pins in a normal operation mode of a semiconductor memory.

It is another object of the present invention to provide a method for selectively outputting internal information of a semiconductor chip, and an output circuit therefore, wherein information relating to an internal power voltage or a reference power voltage of a semiconductor memory, for example, can be externally output as an analog signal without having to add additional output pins for such testing.

It is yet a further object of the present invention to provide an output circuit by which internal information of a semiconductor memory can be externally monitored during a normal operation of a chip.

It is another object of the invention to enable a user or designer to directly monitor various types of internal information during normal operation of a semiconductor chip without adding package pins, so as to improve testing reliability.

To achieve these objects, a method according to one aspect of the invention for outputting internal information in a semiconductor memory comprises the step of selectively outputting internal information through a test pin of a test circuit during a normal operation mode of the semiconductor memory.

In another aspect of the invention, an output circuit for outputting internal information of a semiconductor memory device comprising a test circuit, comprises:

an output terminal;

an output buffer for outputting test data that is generated by the semiconductor memory when the test circuit operates in a test mode;

an analog signal transmitter for providing the output terminal with analog internal information that is generated during a normal operation mode of the semiconductor memory in response to a control signal when the test circuit operates in an internal information output mode; and a control logic circuit for controlling the test circuit in response to external input data that indicates a predetermined internal information output mode, and for generating the control signal in response to the external input data.

In the case that the semiconductor memory is a static random access memory, for example, the test circuit comprises a JTAG circuit for performing a boundary scan test. The digital internal information may comprise a programmable impedance code, an internal clock delay code, an internal reference code, or a sense amplifier delay code, in the semiconductor memory chip. The analog internal information may comprise a reference voltage, an internal power voltage, a reference voltage of internal power voltage, or programmable impedance reference voltage level, in the semiconductor memory chip.

Advantageously, the internal information can be externally output through a conventional test pin of the test circuit in a normal operation mode of a semiconductor memory, thus enabling monitoring of the internal information of the chip without the addition of package pins.

BRIEF DESCRIPTION OF THE DRAWINGS

The foregoing and other objects, aspects and advantages of the present invention will be better understood and become apparent from the following detailed description of preferred embodiments with reference to the drawings, in which.

DETAILED DESCRIPTION OF PREFERRED EMBODIMENTS

Hereinafter, preferred embodiments of the present invention, wherein internal information of a chip such as internal power voltage or reference power voltage can be externally output as a digital or analogue signal without the addition of any separate test pin, will be explained with reference to the accompanying drawings.

Figure 4:
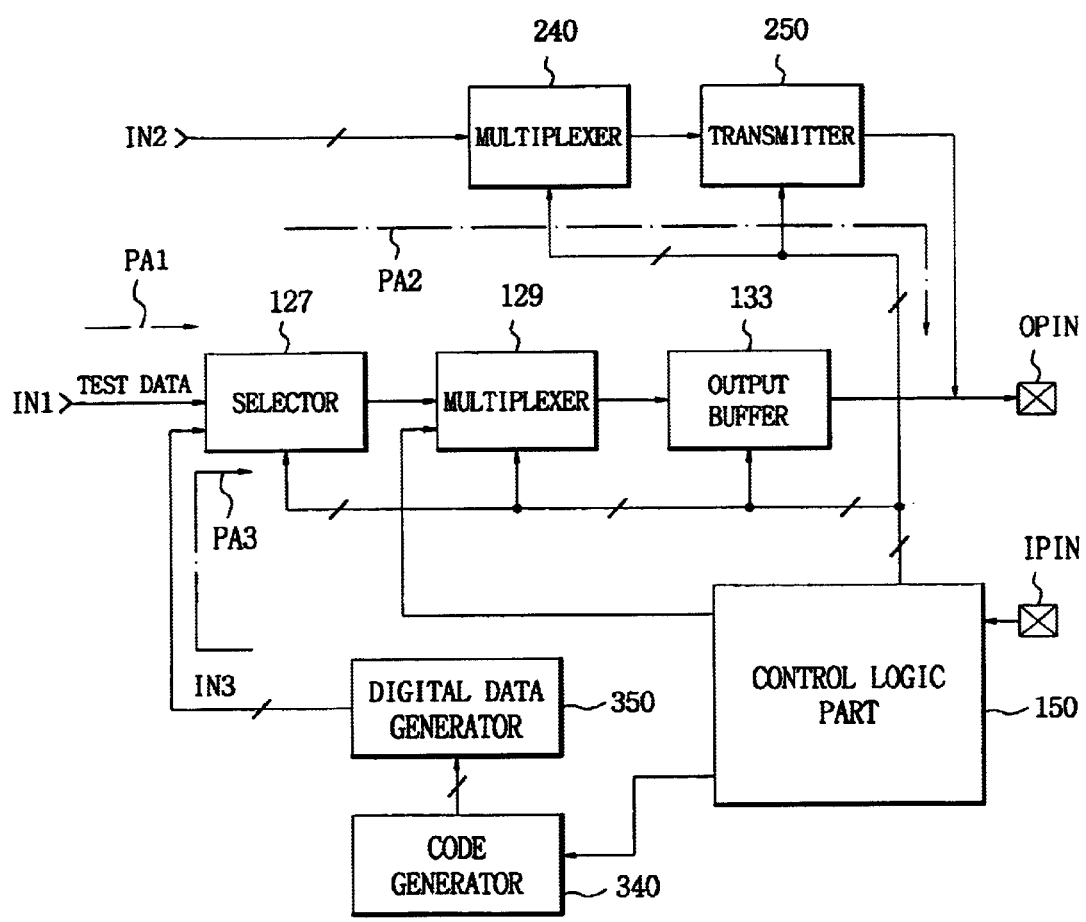
FIG. 4 is a high-level block diagram of a circuit for outputting internal information of a semiconductor chip, according to an embodiment of the present invention.

FIG. 4 is a high-level block diagram of a circuit for outputting internal information, according to an embodiment of the present invention. The circuit comprises an analogue signal transmitter comprising a multiplexer 240 for selecting various analogue signals, and a transmitter 250 for transmitting the output of the multiplexer 240 to an output terminal OPIN. The circuit further comprises a digital signal transmitter comprising a code generator 340 for generating a plurality of digital data in response to a digital code supplied from a control logic circuit 150, a digital data generator 350 for generating various digital data in response to the output of the code generator 340, a selector 127 for selecting one of the various digital data and test data generated in the test mode, a multiplexer 129 for selectively outputting command data or the output of the selector 127.

The output circuit further comprises an output buffer 133 for outputting (to an output terminal OPIN) test data of the semiconductor memory that is generated in a test mode when the circuit test operates in a normal mode.

In general, the control logic 150 controls the circuit during testing in response to external input data input to terminal IPIN. The control logic 150 inputs control signals to the digital signal transmitter and the analogue signal transmitter so that selected internal information is output to the output terminal when the external input data (input at IPIN) indicates the start of a predetermined internal information output mode.

In a preferred embodiment, to output internal information that is generated during a normal operation mode of a semiconductor memory via the test pin OPIN without having to add a separate test pin, the output circuit shown in FIG. 4 is preferably combined with a conventional test circuit such as a conventional JTAG circuit that is used for performing a boundary scan test. It is to be understood that notwithstanding that the exemplary embodiments illustrated herein describe an integration of the internal information output circuit of FIG. 4 with the JTAG circuit, other semiconductor memories may employ output pins of test logic if the memories have test logic therein.

Figure 1:
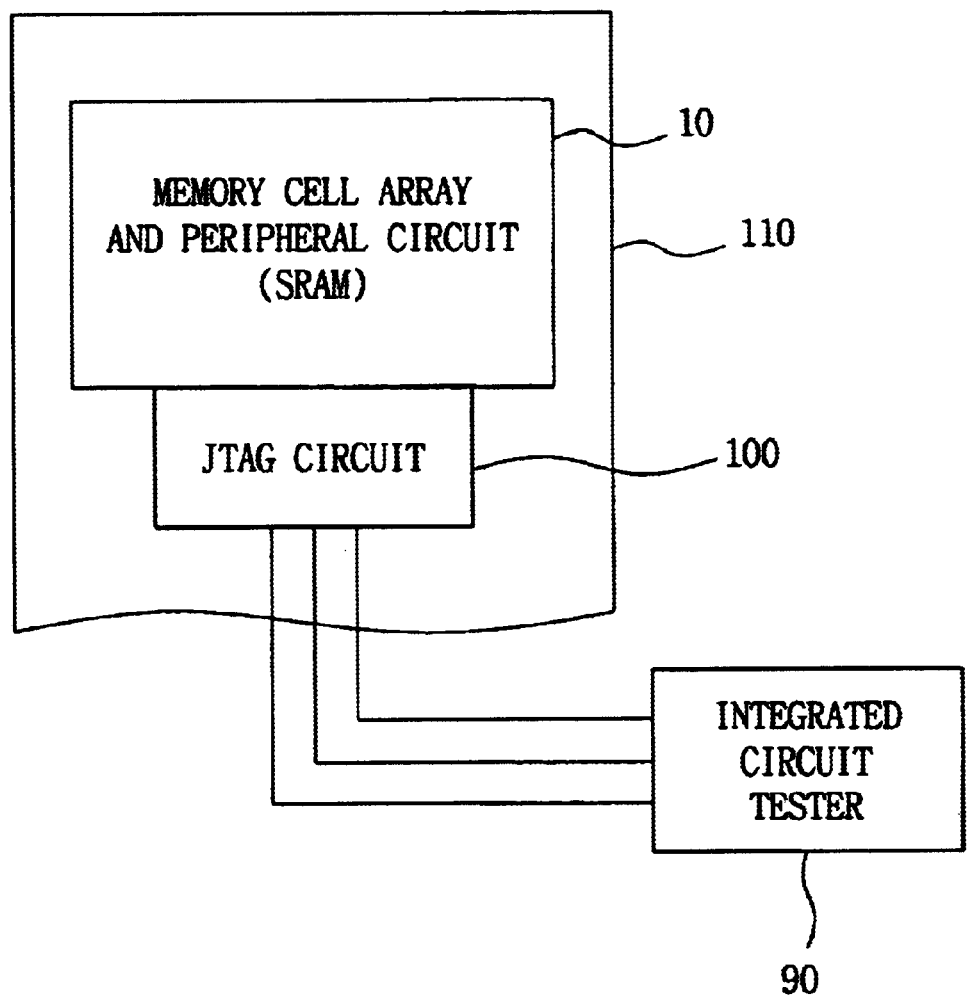
FIG. 1 is a block diagram of a conventional semiconductor memory device comprising a JTAG test circuit.

FIG. 1 is a block diagram of a conventional semiconductor memory device comprising a JTAG test circuit. As shown in FIG. 1, a semiconductor memory device 110 with an SRAM 10 (e.g., high speech SRAM chip) typically comprises a JTAG circuit 100 that is operatively connected to the SRAM 10 for performing a boundary scan test. An externally connected integrated circuit tester 90 is operatively connected to the JTAG circuit 100 for supplying test commands and reading the diagnostic data output from the JTAG circuit 100.

Figure 2:
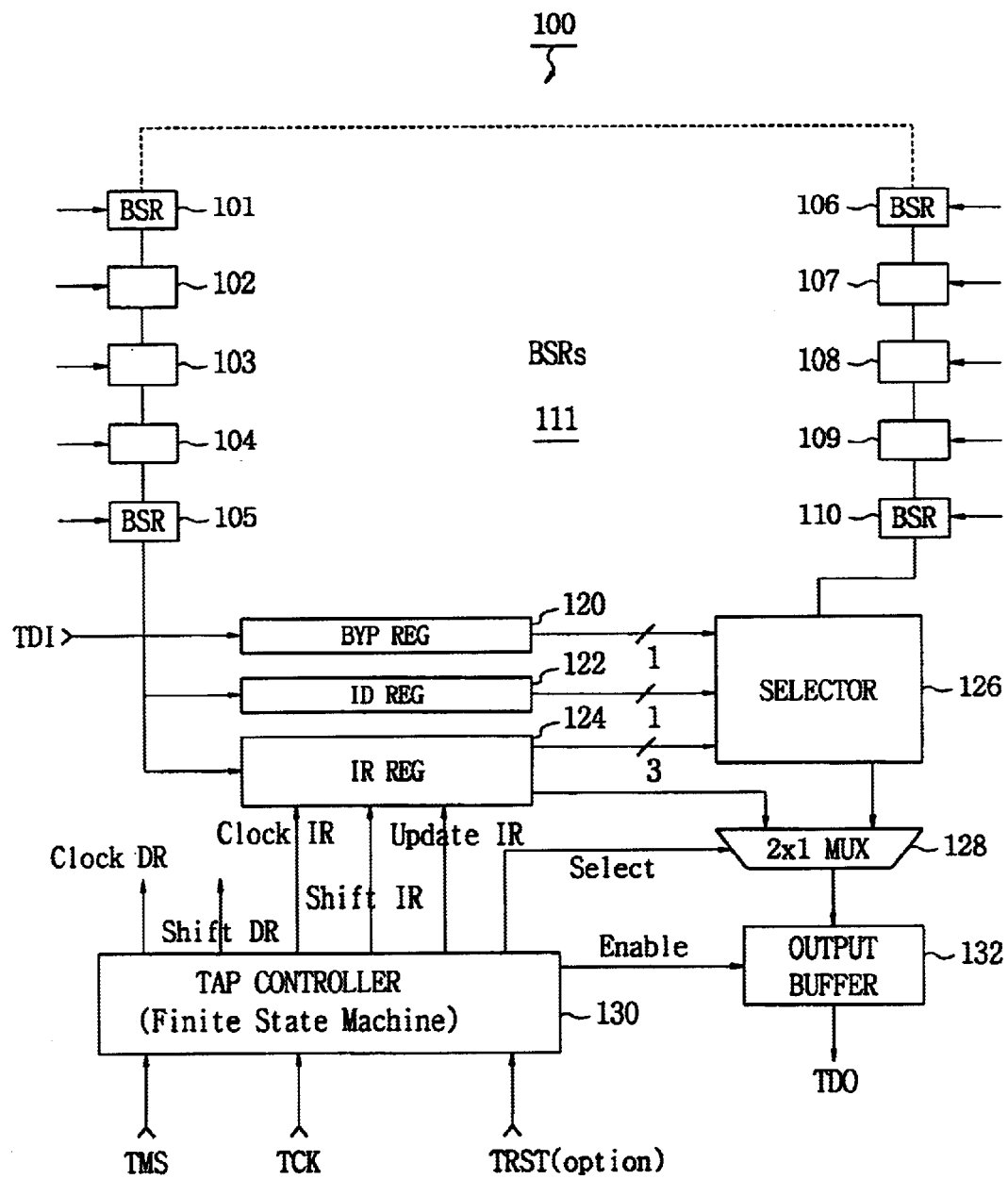
FIG. 2 is a detailed block diagram of the JTAG circuit of FIG. 1.

FIG. 2 is a block diagram of a conventional JTAG circuit 100 as depicted in FIG. 1. In the exemplary embodiments described herein where the output circuit shown in FIG. 4 is combined with a conventional JTAG circuit, it is to be appreciated that an output pin TDO of the JTAG circuit 100 of FIG. 2 is utilized as the output terminal OPIN (shown in FIG. 4). In addition, a multiplexer 128 and output buffer 132 of the JTAG circuit 100 (of FIG. 2) are preferably used as the multiplexer 129 and the output buffer 133 shown in FIG. 4, respectively. Furthermore, a TAP controller 130 of the conventional JTAG circuit shown in FIG. 2 is preferably included in the control logic circuit 150 in FIG. 4. Accordingly, in accordance with a preferred embodiment of the present invention, the test data generated in a conventional boundary scan test mode is output to the output pin TDO through the output buffer 133 (FIG. 4) when the test circuit operates in a conventional test mode. Further, as explained in detail below, internal information that is generated in a normal operation mode is also output via pin TDO during a state in which separate, external input data is input to the test circuit and the test circuit operates in a predetermined internal information output mode.

Referring again to FIG. 4, in addition to a first output path PA1 in which the boundary scan test data input via terminal IN1 is output through the selector 127, the multiplexer 129 and the output buffer 133, the present invention further provides a second path PA2 in which analogue signals input via terminal IN2 are output through the multiplexer 240 and the transmitter 250, and a third path PA3 in which digital data input via terminal IN3 is output through the selector 127, the multiplexer 129 and the output buffer 133. Thus, it is to be appreciated that in accordance with the present invention, the first, second, third paths PA1, PA2, PA3 allow information being input via terminals IN1, IN2, IN3 to be output to the common output terminal OPIN.

Figure 5:
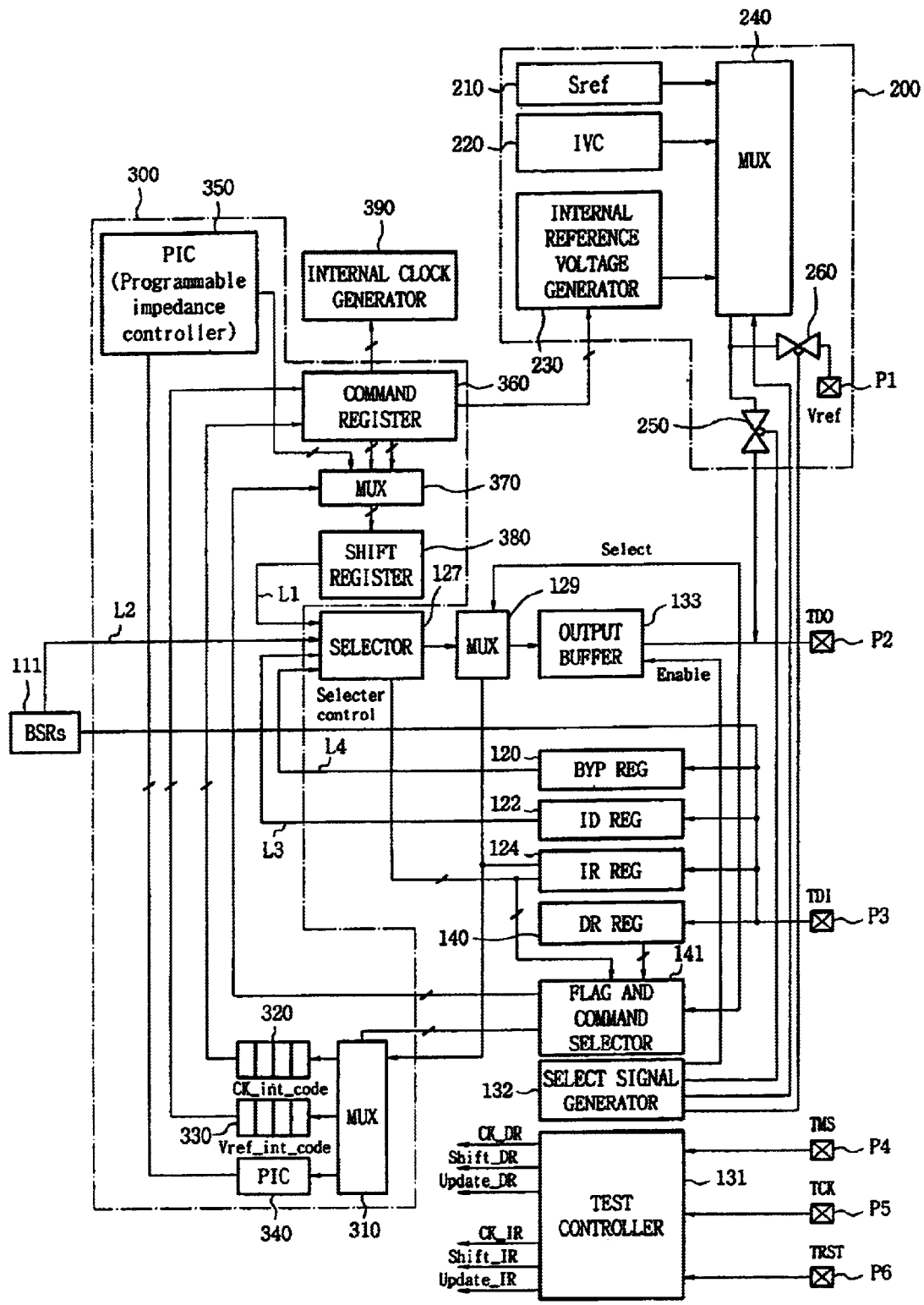
FIG. 5 is a detailed block diagram of a circuit for outputting internal information of a semiconductor chip according to an embodiment of the present invention.

FIG. 5 is a detailed circuit diagram of an internal information output circuit according to the present invention. More specifically, FIG. 5 is an embodiment wherein the output circuit of FIG. 4 is combined with the JTAG circuit shown in FIG. 2. A plurality of boundary scan registers 111 in FIG. 5 may be identical to a BSRs block 111 shown in FIG. 2. Further, the boundary scan registers 111 may be provided in an input/output buffer to improve the boundary scan performance.

Figure 3:
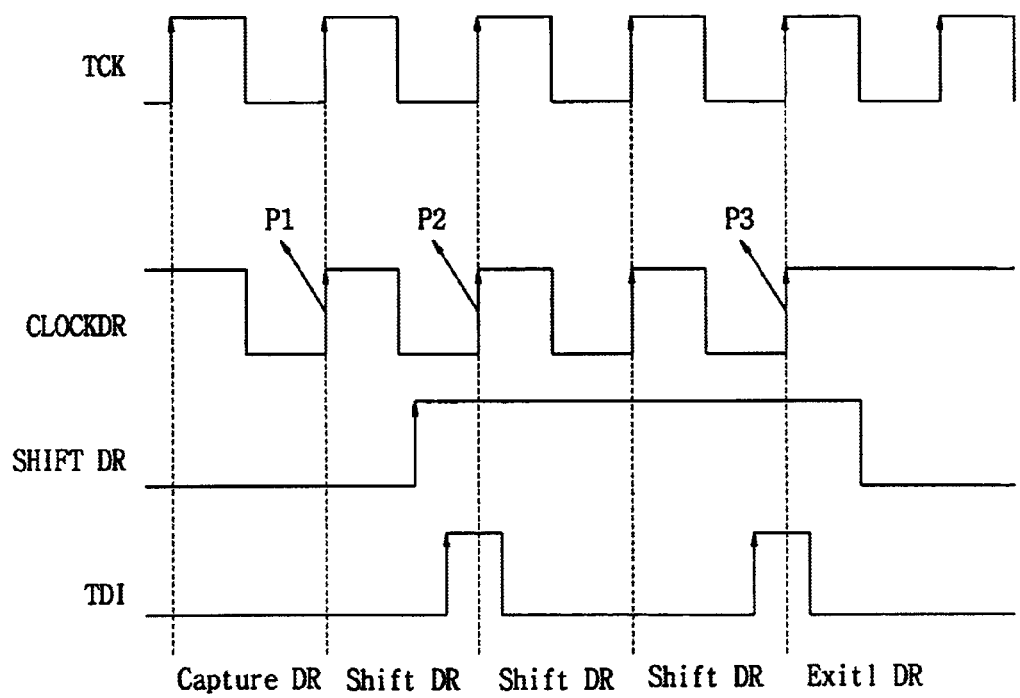
FIG. 3 is a timing diagram illustrating a test data input relating to the circuit of FIG. 2.

To provide a better understanding of the circuit of FIG. 5, a detailed discussion of the circuits of FIGS. 2 and 3, wherein a conventional JTAG circuit 100 is connected to an SRAM 10 in the same semiconductor chip, will now be provided. As shown in FIG. 2, the JTAG circuit 100 comprises a boundary scan register block 111 having a plurality of boundary scan registers 101-110. The JTAG circuit 100 further comprises a bypass register 120, an identification (ID) register 122, and a command register 124. In addition, the JTAG circuit 100 comprises a selector 126 for selecting the boundary scan data, a multiplexer 128 for selectively outputting data output from the selector 126 and the command register 124, and an output buffer 132 for outputting data to a test data output pin TDO. A test access port (TAP) controller 130 receives controls signals such as a test mode select (via TMS terminal), test clock (via TCK terminal), and an optional test reset (via TRST terminal) from the integrated circuit tester 90 (shown in FIG. 1). In response, the TAP controller outputs timing control signals CLOCKDR and SHIFTDR (as further shown in FIG. 3). The test data input terminal TDI connected to the inputs of the registers 105, 120, 122, 124 is input with series data. The series data is sampled at a rising edge of the test clock (TCK) and is input to a data register such as the command register 124 or BSR 111, ID register 122, bypass register 120 in response to a test command mode signal (TMS).

The time points P1, P2, P3 shown in FIG. 3 respectively indicate parallel data input, series data input start, and series data input end. For example, in a conventional test mode, when command codes IR2, IR1, IR0, are input having logic states of 0, 0, 0, respectively, the command becomes SAMPLE-Z and the data output of TDO is the output of the boundary scan register. In case that the integrated circuit tester 90 determines that the data stream output (which was shifted in series by the boundary scan register) is different from the data stream inputted, the output pins of the SRAM 10 is regarded as being defective. In addition, when the command codes IR2, IR1, IR0 are input with 0, 1, 1, the command is bypassed, the data output from TDO is the output of the bypass register.

In a preferred embodiment of the present invention, new command codes IR2, IR1, IR0 are defined as having logic states 1, 1, 0, respectively. In other words, to externally output internal information that is created in a normal operation mode of a semiconductor memory, the command codes 1, 1, 0 are input through the input pin TDI, and are then shifted to a new user mode according to the present invention (not the boundary scan test mode) by the TAP controller 130. Indeed, because the command code data 1, 1, 0 are not used as input codes in a conventional JTAG circuit, the data are defined as the user mode for outputting internal information of the semiconductor chip that is created during a normal operation mode of the chip. It is to be appreciated that any undefined codes can be utilized to define such command.

Referring again to FIG. 5, the selector 127, multiplexer 129, and output buffer 133 are the components described above with reference to FIG. 4 and have the same functions. An analogue signal transmitter 200 (which corresponds to the analogue signal transmitter of FIG. 4) comprises a multiplexer 240 and the transmission gates 250 and 260. The multiplexer 240 receives as input analog signals such as a reference voltage Sref of the internal power voltage, an internal power voltage IVC and an internal reference voltage. The reference voltage Sref of the internal power voltage, the internal power voltage IVC and the internal reference voltage are respectively output from a reference voltage generator 210 of the internal power voltage, an internal power voltage generator 220 and an internal reference voltage generator 230, which are arranged in a peripheral circuit of SRAM and well known by those skilled in the art.

The blocks 310, 320, 330, 340, 350, 360, 370, 380 within block 300, the selector 127, and the multiplexer 129 correspond to the digital signal transmitter of FIG. 4. The BSRs 111, BYP REG 120, ID REG 122, IR REG 124, DR REG 140, flag and command selector 141, select signal generator 132, and test controller 131 correspond to the control logic 150 shown in FIG. 4. The select signal generator 132 generates a control signal to disable the output buffer 133 when an analogue signal is output at the state of entering into the predetermined user mode (i.e., the internal information output mode). The select signal generator 132 generates a control signal that is sent to the analogue signal transmitter 200 for controlling the analogue path. In addition, the flag and command selector 141 generates control signals to the multiplexers 129, 310, 370 to control the digital output path when digital data is output at the state of entering into the internal information output mode.

The detailed realization of the select signal generator 132 and the flag and command selector 141 can also be achieved by additional circuit design to modify the TAP controller 130 in FIG. 2. Those of ordinary skill in the art could readily envision such realizations based on the teachings herein.

In the exemplary embodiment of FIG. 5, pin P2 is connected to the output pad TDO of the JTAG circuit for testing data output there from, and pin P3 is connected to input pad TDI for receiving input test data. Similarly, pins P4, P5, and P6 respectively indicate the TMS, TCK, and TRST input pads. More specifically, it is to be appreciated that the present invention allows digital data or an analog signal, which are generated when the semiconductor memory operates in a normal operation mode, to be selectively output through a common output pin of the conventional test circuit without adding of external pins in the chip package. In addition, the transmission gate 260 allows analog signals outputted from the multiplexer 240 to be output through the reference voltage pad P1.

During a conventional JTAG boundary scan operation mode, the command codes IR2, IR1, IR0 are input as 0, 0, 0 through pin P3. The codes are then stored in the IR register 124 and the test controller 131 sets up the circuit of FIG. 5 in a boundary scan operation mode. Subsequently, if data codes are input as 1, 0, 1, 0 through the pin P3 to thereby supply it to the boundary scan register block 111, series data shift is performed in order. As a result, the boundary scanned test data appears as a data stream at line L2. Then, in response to a select control signal output from the IR register 124, the selector 127 selects the input of line L2 for input to the multiplexer 129. Then, in response to a control signal from the flag and command selector 141, the multiplexer 129 sends the output of the selector 127 to the output buffer 133. At this time, the output buffer 133 is in an "enable" state (as per a control signal from the select signal generator 132) and, consequently, provides the output terminal TDO with the data stream. Then, the external integrated circuit tester 90 (FIG. 1) receives the data stream and checks whether the data steam corresponds to the input data stream 1, 0, 1, 0. If the received data stream is not 1, 0, 1, 0, it is determined that there is either a pin short or an open defect. In that operation, the semiconductor memory, for instance, SRAM operates not in a normal operation mode in which data is accessed, but in a test mode.

The operation of FIG. 5 with respect to outputting internal information according to the present invention will now be explained with further reference to FIG. 6, which is a state diagram illustrating transitions between operational modes of the circuit shown in FIG. 5 for outputting internal information of the semiconductor chip.

Figure 6:
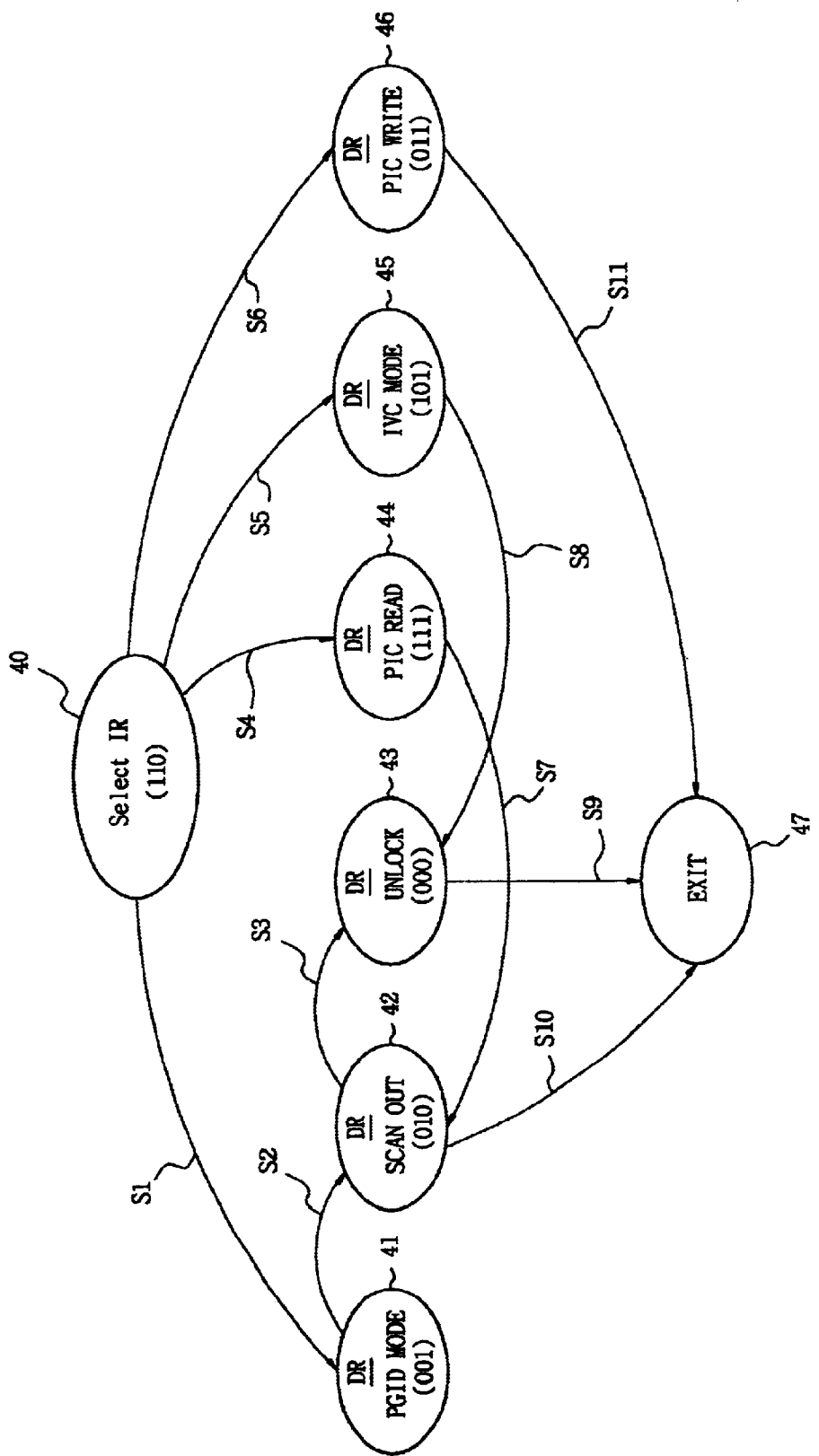
FIG. 6 is a state diagram of exemplary operational modes of the circuit of FIG. 5 for outputting internal information of a semiconductor chip.

As shown in FIG. 6, when command data 1, 1, 0 is input (state 40), the circuit enters into a mode in which internal information that is generated during normal operation of the chip can be output for evaluation. Subsequently, when command codes 1, 1, 1 are input, for example, the test controller 131 performs the fourth step S4 (which indicates a transition from state 40 to state 44) to execute an PIC read operation, and then a SCAN OUT operation (transition from state 44 to state 42, i.e., step S7). According to these processes, the test controller 131 recognizes that the currently input command is not a JTAG test mode, but rather a user mode, in particular, an operation mode in which digital data output from the programmable controller 350 is output through the output pin TDO. In this case, the semiconductor memory is in a normal operation mode.

More specifically, the programmable impedance controller 350 in FIG. 5 receives the programmable impedance control code from PIC block 340 to perform an impedance control operation, and provides multiplexer 370 with the programmable control code. The multiplexer 370 provides the shift register 380 with the control code in response to a control signal that is output from the flag and command selector 141. The shift register 380 converts the control codes that are supplied in parallel to series codes and outputs the series codes to the selector 127 through the line L1. The selector 127 selects as input the data on line L1 in response to a select control signal that is output from the IR register 124 and inputs it to the multiplexer 129. The multiplexer 129 provides the output buffer 133 with the output of the selector 127 in response to a control signal that is output from the flag and command selector 141. At this time, since the output buffer 133 is in an "enable" state, the buffer 133 provides the programmable impedance control code to the output terminal TDO. Accordingly, a circuit designer or a user can receive and analyze codes that are output from the output terminal TDO and thereby check whether the programmable impedance controller 350 operates normally in response to the programmable control code that is inputted.

Referring again to FIG. 6, when the command codes are first provided as 1, 1, 0 (step 40), and then as 1, 0, 1, the fifth step S5 (which indicates a transition from state 40 to state 45) is performed by the test controller 131. Accordingly, referring to FIG. 5, the test controller 131 recognizes the currently input command as a user mode of the present invention, not the JTAG test mode. More specifically, this mode is recognized as an operation mode in which analogue data, which is output from the internal power voltage generator 220, is output through the output pin TDO. In this case, of course, the semiconductor memory is in a normal operation state, wherein in response to a multiplexing control signal output from the select signal generator 132, the multiplexer 240 sends to the transmission gate 250 the internal power voltage that is output from the internal power voltage generator 220. The transmission gate 250 transmits the internal power voltage to the output terminal TDO in response to a gating control signal output from the select signal generator 132. Accordingly, a circuit designer or user can check the level of the practical internal power voltage that is output through the output terminal TDO. In this case, the output buffer 133 enters into a "disable" state in response to a control signal output from the select signal generator 132.

Referring again to FIG. 6, after the mode in which the internal power voltage is output is completed, the codes 0, 0, 0 are input through pin TDI, and an unlock mode is performed (transition from state 45 to state 43, i.e., step S8), which completes via step S9 (transition from state 43 to state 47). The unlock mode (state 43) is a mode by which the operation is performed without locking after codes are input. The PGID mode (state 41) is an operation mode in which in case that there is a plurality of programmable ID devices, each of the corresponding IDs is assigned to the devices and the assigned IDs are identified. The PIC write mode (state 46) is a mode in which PIC codes are written by the IR register 124.

In addition, to check whether the command code being input is normally input, the output of the IR register 124 can be output to the output terminal TDO through the output buffer 133 by controlling the multiplexer 129. Further, the ID data, bypass data that are input through the input lines L3, L4 can be output to the output terminal TDO through the output buffer 133.

By the operation of FIG. 5 (via the state diagram shown in FIG. 6, for example), digital internal information such as programmable impedance code, internal clock delay code, internal reference code, or sense amp delay code in the semiconductor memory chip can be externally output through the digital transmission path. In addition, the reference voltage, internal power voltage, reference voltage of the internal power voltage, or programmable impedance reference voltage level in the semiconductor memory chip can be output and checked externally.

Advantageously, the circuit of FIG. 5 (and its operation according to the state diagram of FIG. 6) enables a designer or a user to directly monitor the internal information of a semiconductor memory chip. Thus, a semiconductor developer can effectively test a chip at an early state of development without adding any separate pins. Moreover, a user can check an internal reference voltage, a data sampling clock, and an internal timing delay. As described in the foregoing, the circuit of the present invention directly can monitor the state of various internal signals that appear in a normal operation of chip without adding of package pins, thereby enhancing reliability in test even without addition of pins.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for outputting internal information in a semiconductor memory, the method comprising:

selectively outputting through a test pin of a JTAG test circuit internal information that is generated during a normal operation mode of the semiconductor memory or test data that is generated during a test mode of operation of the semiconductor memory, wherein selectively outputting comprises:

controlling a first output circuit, which is connected to the test pin, to selectively output test data when the JTAG test circuit operates in a test mode or digital internal information when the JTAG test circuit operates in a first internal information output mode; and controlling a second output circuit, which is connected to the test pin, to selectively output analog internal information when the JTAG circuit operates in a second internal information output mode.

2. The method of claim 1, wherein the test circuit comprises a JTAG circuit for performing a boundary scan test.

3. The method of claim 1, wherein the analog internal information comprises information associated with an internal power voltage or a reference power voltage of the semiconductor memory.

4. The method of claim 1, wherein the digital internal information comprises a programmable impedance code, an internal clock delay code, an internal reference code, or a sense amplifier delay code, in the semiconductor memory chip.

5. An output circuit for outputting internal information of a semiconductor memory device comprising a JTAG test circuit, the output circuit comprising;

an output terminal connected to an output pin of the JTAG test circuit;

an output buffer, connected to the output terminal, for selectively outputting test data that is generated by the semiconductor memory when the JTAG test circuit operates in a test mode or digital internal information that is generated by the semiconductor memory when the JTAG test circuit operates in an internal information output mode;

a digital signal transmitter connected to the output buffer, wherein the digital signal transmitter provides the digital internal information that is output from the output buffer when the JTAG test circuit operates in an internal information output mode; and a control logic circuit which receives external input data that indicates a test mode or a predetermined internal information output mode, and generates one or more control signals to control the JTAG test circuit and the digital signal transmitter in response to the external input data, wherein the digital signal transmitter comprises:

a code generator for generating a digital data in response to a digital code being supplied from the control logic circuit;

a digital data generator for generating digital data in response to the output of the code generator;

a selector for selecting one of the digital data output from the digital data generator and test data generated in the test mode; and a multiplexer for selectively outputting one of command data and the output of the selector.

6. An output circuit for outputting internal information of a semiconductor memory device comprising a JTAG test circuit, the output circuit comprising:

an output terminal connected to an output pin of the JTAG test circuit;

an output buffer, connected to the output terminal, for outputting test data that is generated by the semiconductor memory when the JTAG test circuit operates in a test mode;

an analog signal transmitter connected to the output terminal, wherein the analog signal transmitter provides the output terminal with analog internal information that is generated during a normal operation mode of the semiconductor memory when the JTAG test circuit operates in an internal information output mode; and a control logic circuit which receives external input data that indicates a test mode or a predetermined internal information output mode, and generates one or more control signals in response to the external input data for controlling the JTAG test circuit and the analog signal transmitter, for disabling the output buffer when the JTAG test circuit operates in an internal information output mode to output analog internal information to the output terminal, and for enabling the output buffer when the JTAG test circuit operates in a test mode to output test data, wherein the analog signal transmitter comprises:

a multiplexer selecting one of a plurality of analog signals; and a transmission circuit for transmitting the output of the multiplexer to the output terminal.

7. An output circuit for outputting internal information of a semiconductor memory device comprising a JTAG test circuit, the output circuit comprising:

an output terminal connected to an output pin of the JTAG test circuit;

an output circuit comprising an output buffer connected to the output terminal, wherein the output circuit selectively outputs test data that is generated by the semiconductor memory when the JTAG test circuit operates in a test mode or digital information that is generated during a normal operation mode of the semiconductor memory when the JTAG circuit operates in a first internal information output mode;

a digital signal transmitter which includes the output circuit and which provides the output buffer with the digital internal information that is generated during a normal operation mode of the semiconductor memory;

an analog signal transmitter connected to the output terminal, wherein the analog signal transmitter provides the output terminal with analog internal information that is generated during a normal operation mode of the semiconductor memory when the JTAG test circuit operates in a second internal information output mode; and a control logic circuit which receives external input data that indicates a test mode or a predetermined internal information output mode, and generates one or more control signals in response to the external input data for controlling the JTAG test circuit, digital signal transmitter and the analog signal transmitter, for disabling the output buffer when the JTAG test circuit operates in the second internal information output mode to output analog internal information to the output terminal, and for enabling the output buffer when the JTAG test circuit operates in the test mode to output test data to the output terminal or in the first internal information output mode to output digital internal information to the output terminal.

8. The circuit of claim 7, wherein the test circuit comprises a JTAG circuit for performing a boundary scan test.

9. The circuit of claim 8, wherein the JTAG circuit is connected to an external integrated circuit tester through an interface.

10. The circuit of claim 7, wherein the internal information comprises information associated with an internal power voltage or a reference power voltage of the semiconductor memory.

11. The circuit of claim 7, wherein the digital internal information comprises a programmable impedance code, an internal clock delay code, an internal reference code, or a sense amplifier delay code, in the semiconductor memory chip.

12. The circuit of claim 7, wherein the analog internal information comprise a reference voltage, a reference voltage of the internal power voltage, or a programmable impedance reference voltage level, in the semiconductor memory chip.

13. The circuit of claim 7, further comprising a transmission gate, operatively connected between the analog signal transmitter and a reference power voltage output pad, for outputting analog internal information to the reference power voltage output pad.

14. The circuit of claim 7, wherein the digital signal transmitter comprises:

a code generator for generating a digital data in response to a digital code being supplied from the control logic circuit;

a digital data generator for generating digital data in response to the output of the code generator;

a selector for selecting one of the digital data output from the digital data generator and test data generated in the test mode; and a multiplexer for selectively outputting one of command data and the output of the selector.

15. The circuit of claim 7, wherein the analog signal transmitter comprises:

a multiplexer selecting one of a plurality of analog signals; and a transmission circuit for transmitting the output of the multiplexer to the output terminal.

16. The circuit of claim 7, wherein the control logic circuit comprises a TAP controller, a command register, and a select signal generator.

\* \* \* \* \*